US012640682B2

(12) United States Patent
Wang et al.

(10) Patent No.: US 12,640,682 B2
(45) Date of Patent: May 26, 2026

(54) HIGH-FREQUENCY CRYSTAL OSCILLATOR BASED ON AUTOMATIC PHASE ERROR CORRECTION

(71) Applicants:Nanjing University Of Posts And Telecommunications, Jiangsu (CN); NANTONG INSTITUTE OF NANJING UNIVERSITY OF POSTS AND TELECOMMUNICATIONS CO., LTD., Jiangsu (CN)

(72) Inventors: Zixuan Wang, Jiangsu (CN); Xin Wang, Jiangsu (CN); Zhikuang Cai, Jiangsu (CN); Yufeng Guo, Jiangsu (CN); Jiafei Yao, Jiangsu (CN); Wenjing Zhang, Jiangsu (CN); Yunjin Yin, Jiangsu (CN); Zushuai Xie, Jiangsu (CN)

(73) Assignees: Nanjing University of Posts and Telecommunications, Jiangsu (CN); NANTONG INSTITUTE OF NANJING UNIVERSITY OF POSTS AND TELECOMMUNICATIONS CO., LTD., Jiangsu (CN)

( * ) Notice: Subject to any disclaimer, the term of this patent is extended or adjusted under 35 U.S.C. 154(b) by 62 days.

(21) Appl. No.: 18/863,653

(22) PCT Filed: Mar. 23, 2023

(86) PCT No.: PCT/CN2023/083227
§ 371 (c)(1),
(2) Date: Nov. 7, 2024

(87) PCT Pub. No.: WO2024/103589
PCT Pub. Date: May 23, 2024

(65) Prior Publication Data
US 2026/0112996 A1 Apr. 23, 2026

(30) Foreign Application Priority Data

Nov. 14, 2022 (CN) .......................... 202211419950.9

(51) Int. Cl.
| | |
|---|---|
| *H03B 5/06* | (2006.01) |
| *H03B 5/36* | (2006.01) |
| *H03L 3/00* | (2006.01) |

(52) U.S. Cl.
CPC ............... *H03B 5/06* (2013.01); *H03B 5/364* (2013.01); *H03L 3/00* (2013.01); *H03B 2200/0094* (2013.01)

(58) Field of Classification Search
CPC ... H03B 5/06; H03B 5/30; H03B 5/32; H03B 5/36; H03B 5/362; H03B 5/364;
(Continued)

(56) References Cited

U.S. PATENT DOCUMENTS

| | | | |
|---|---|---|---|
| 5,646,562 A | 7/1997 | Abe | |
| 7,009,458 B2 * | 3/2006 | Gazit | ....................... H03B 5/06 331/46 |

(Continued)

FOREIGN PATENT DOCUMENTS

| | | |
|---|---|---|
| CN | 102158208 | 8/2011 |
| CN | 112217476 | 1/2021 |

(Continued)

OTHER PUBLICATIONS

"International Search Report (Form PCT/ISA/210) of PCT/CN2023/083227", mailed on Jun. 23, 2023, with English translation thereof, pp. 1-4.

(Continued)

*Primary Examiner* — Levi Gannon
(74) *Attorney, Agent, or Firm* — JC ONE WORLD

(57) ABSTRACT

Disclosed in the present invention is a high-frequency crystal oscillator based on automatic phase error correction.
(Continued)

The high-frequency crystal oscillator comprises a high-frequency crystal, a load capacitor, two single-pole double-throw switches, a ring oscillator, an 8-frequency-dividing circuit, a twisted ring counter, a peak detector, a buffer, a digital module, a multiplexer and an amplifier. In the present invention, when a circuit performs energy injection on a high-frequency crystal, a phase error between an injection signal and a crystal oscillation signal is also detected and automatically corrected, such that the phase error is always less than 45 degrees. The present invention ensures the continuous and efficient linear growth in the energy inside a high-frequency crystal, and greatly shortens the starting time required for the crystal to reach a stable oscillation amplitude, thereby realizing rapid starting; and on the basis of automatic phase error correction technology.

7 Claims, 10 Drawing Sheets

(58) Field of Classification Search
CPC .................... H03B 5/366; H03B 5/368; H03B 2200/0094; H03L 3/00
See application file for complete search history.

(56) References Cited

U.S. PATENT DOCUMENTS

| 2014/0009234 A1* | 1/2014 | Aichner | .................. H03B 5/36 |
| | | | 331/49 |
| 2020/0244220 A1* | 7/2020 | Van der Zee | ......... H03B 5/364 |

FOREIGN PATENT DOCUMENTS

| CN | 114584133 | 6/2022 |
| CN | 115498998 | 12/2022 |

OTHER PUBLICATIONS

"Written Opinion of the International Searching Authority (Form PCT/ISA/237) of PCT/CN2023/083227", mailed on Jun. 23, 2023, pp. 1-4.

* cited by examiner

HIGH-FREQUENCY CRYSTAL OSCILLATOR BASED ON AUTOMATIC PHASE ERROR CORRECTION

CROSS-REFERENCE TO RELATED APPLICATION

This application is a 371 of international application of PCT application serial no. PCT/CN2023/083227, filed on Mar. 23, 2023, which claims the priority benefit of China application no. 202211419950.9, filed on Nov. 14, 2022. The entirety of each of the above mentioned patent applications is hereby incorporated by reference herein and made a part of this specification.

TECHNICAL FIELD

The present disclosure belongs to the technical field of the integrated circuits.

RELATED ART

Crystal oscillators are widely used in integrated circuits and are the basic components of the frequency multiplication operation of the phase-locked loop system. The startup time of the crystal oscillator affects the time interval of the data transmission and reception time of the entire system and plays a decisive role in the power consumption of the system using the duty cycle operating mode. With the rapid development of the integrated circuits and the popularization of the low-power application scenarios, it is crucial important to design a rapid startup high-frequency crystal oscillator.

At present, the structures of the rapid startup high-frequency crystal oscillators are mainly divided into two types, one is a high-frequency crystal oscillator based on a traditional transconductance amplifier, and the other is a rapid startup high-frequency crystal oscillator based on an energy injection. The startup of the rapid startup high-frequency crystal oscillator based on the traditional transconductance amplifier mainly depends on the negative resistance of the circuit, and is supplemented by the load regulation technology, so that a larger loop gain is obtained by the high-frequency crystal during the startup process to implement the rapid startup. However, the implementation of this method is limited by the initial energy state of the crystal, and the transconductance amplifier is required to amplify and select the weak noise signal in the crystal, and even with other auxiliary technologies, the startup time can merely be relatively reduced, and cannot be significantly reduced. The energy injection is adopted by the rapid startup high-frequency crystal oscillator based on the energy injection to help the crystal establish an energy state and complete the frequency selection in a shorter time. After the crystal amplitude reaches the expected the amplitude, the energy injection is disconnected, and the crystal is in connection with the amplifier for maintaining the steady-state oscillation of the crystal.

Currently, the energy injection solution is the mainstream rapid startup solution. In comparison with the traditional amplifiers, the advantages of the energy injection are that the time of the frequency-selective amplification of the crystal is significantly reduced, the energy growth is rapidly increased in a short time, and the startup time is significantly reduced. However, a double-terminal injection method is adopted in most current energy injections, that is, the differential injection is performed at both terminals of the crystal. Since both terminals of the crystal have the square wave injection signals during the injection process, the injection effect cannot be determined before the injection is completed. Therefore, the current mainstream energy injection methods are blind, which is impossible to monitor the injection situation in real time during the injection process, and is impossible to determine whether the injection is effective or the injection duration is optimal. In addition, the energy injection efficiency is related to the phase error between the injection signal and the oscillation signal, when the phase error is greater than 45°, the energy injection efficiency is significantly reduced. Since the injection signal frequency cannot be exactly equal to the oscillation frequency, the frequency difference between the injection signal and the oscillation can cause the phase error to be accumulated over the time. In the current mainstream energy injection solution, the energy injection time is limited by the frequency difference between the injection signal frequency and the oscillation frequency. For the larger frequency errors, the energy obtained by the crystal from the energy injection process is extremely small, because the larger frequency difference means the rapid phase error accumulation and the less energy injection.

SUMMARY OF INVENTION

The objectives of the present disclosure are as follows. In order to solve the problems existing in the above-mentioned prior art, a high-frequency crystal oscillator based on automatic phase error correction is provided in the present disclosure.

Technical solutions are as follows. A high-frequency crystal oscillator based on an automatic phase error correction is provided in the present disclosure. The high-frequency crystal oscillator comprises a high-frequency crystal, a first load capacitor, a second load capacitor, a ring oscillator, an 8-frequency-dividing circuit, a twisted ring counter, a peak detector, a buffer, a digital module, a multiplexer, an amplifier, a first single-pole double-throw switch and a second single-pole double-throw switch; one terminal of the high-frequency crystal is recorded as an $XO_{IN}$, and another terminal of the high-frequency crystal is recorded as an $XO_{OUT}$; a fixed terminal of the first single-pole double-throw switch is in connection with the $XO_{IN}$ terminal of the high-frequency crystal, a first moving terminal of the first single-pole double-throw switch is in connection with the multiplexer, and a second moving terminal of the first single-pole double-throw switch is in connection with one terminal of the first capacitor and an input terminal of the amplifier; a fixed terminal of the second single-pole double-throw switch is in connection with the $XO_{OUT}$ terminal of the high-frequency crystal, a first moving terminal of the second single-pole double-throw switch is in connection with the peak detector, a second moving terminal of the second single-pole double-throw switch is in connection with one terminal of the second capacitor and an output terminal of the amplifier, and another terminals of the first and second capacitors are both grounded.

When the high-frequency crystal oscillator is started, a digital module is adopted to generate a switch control signal $EN_{INJ}$ for controlling the fixed terminal of the first single-pole double-throw switch to be in connection with the first moving terminal of the first single-pole double-throw switch, and controlling the fixed terminal of the second single-pole double-throw switch to be in connection with the first moving terminal of the second single-pole double-throw switch; and the ring oscillator is configured to generate a square wave signal $F_{64\times}$, and transmit the square wave signal to the 8-frequency-dividing circuit and the peak detector; the 8-frequency-dividing circuit is configured to divide the square wave signal to generate a frequency-dividing signal $F_{8\times}$, and transmit the $F_{8\times}$ to the twisted ring counter, and the twisted ring counter is configured to divide the $F_{8\times}$ again to generate eight signals Phase[7:0] with a same frequency and different phases, and transmit the signals Phase[7:0] to the multiplexer; the peak detector is further configured to receive a signal $PKD_{IN}$ output by the $XO_{OUT}$ terminal of the high-frequency crystal, and the peak detector is configured to utilize the square wave signal $F_{64\times}$ as a high-frequency operating clock, reflect a peak position of the signal $PKD_{IN}$ by outputting a pulse signal $PKD_{OUT}$, and transmit the pulse signal $PKD_{OUT}$ to the buffer; and the buffer is configured to expand a negative pulse width of the pulse signal $PKD_{OUT}$ and transmit a $BUFF_{OUT}$ to the digital module after an expanded pulse signal $BUFF_{OUT}$ is obtained; the digital module is configured to generate initial control signals EN[7:0], the control signals EN[7:0] are eight-bit control signals, the digital module is configured to switch the control signals EN[7:0] by discriminating an edge relation between a signal $PD_{IN}$ and the signal $BUFF_{OUT}$, and transmit the switched control signals EN[7:0] to the multiplexer; the multiplexer is configured to select one signal from signals Phase[7:0] according to a magnitude of the frequency of the square wave signal $F_{64\times}$ and the control signals EN[7:0], and record the signal as the signal $PD_{IN}$ to input into the digital module; the multiplexer is further configure to select one signal from the signals Phase[7:0] as an injection signal according to the control signals EN[7:0] and inject the signal into the $XO_{IN}$ terminal of the high-frequency crystal through the first single-pole double-throw switch, and the injection signal is coupled to the $XO_{OUT}$ terminal through the high-frequency crystal, and is superimposed with a high-frequency oscillation signal $F_{OSC}$ generated by the high-frequency crystal at the $XO_{OUT}$ terminal to obtain the signal $PKD_{IN}$, and the signal $PKD_{IN}$ is input to the peak detector through the second single-pole double-throw switch.

In a maintenance stage, the control signal $EN_{INJ}$ is for controlling the fixed terminal of the first single-pole double-throw switch to be in connection with the second moving terminal of the first single-pole double-throw switch, and controlling the fixed terminal of the second single-pole double-throw switch to be in connection with the second moving terminal of the second single-pole double-throw switch.

Further, the twisted ring counter includes first to fourth triggers; the first to fourth triggers are all D triggers having a data input terminal, a clock control terminal, a first output terminal and a second output terminal, and a signal output by the second output terminal of the D trigger is an inverted signal of a signal output by the first output terminal; the clock control terminals of the first to fourth triggers are all in connection with the signal $F_{8\times}$.

The data input terminal of the first trigger is in connection with the first output terminal of the fourth trigger, a signal output by the first output terminal of the first trigger is served as a first bit signal in the Phase[7:0] and recorded as a Phase[0], and in connection with the data input terminal of the second trigger; a signal output by the first output terminal of the second trigger is served as a second bit signal in the Phase[7:0] and recorded as a Phase[1], and in connection with the data input terminal of the third trigger; a signal output by the first output terminal of the third trigger is served as a third bit signal in the Phase[7:0] and recorded as a Phase[2], and in connection with the data input terminal of the fourth trigger; a signal output by the first output terminal of the fourth trigger is served as a fourth bit signal in the Phase[7:0] and recorded as a Phase[3]; signals output by the second output terminals of the first to fourth triggers are respectively served as the fifth, sixth, seventh and eighth bit signals in the Phase[7:0], and sequentially recorded as a Phase[4], a Phase[5], a Phase[6] and a Phase[7]; and a phase of a signal Phase[j] is 45° ahead of a phase of a signal Phase[j+1], where j–0, 1, 2, . . . 6.

Further, the peak detector includes a dynamic comparator, a third capacitor, a PMOS tube, an NMOS tube and a current source; an inverting input terminal of the dynamic comparator served as an input terminal of the peak detection is in connection with the signal $PKD_{IN}$; a non-inverting input terminal of the dynamic comparator is in connection with a drain of the NMOS tube and one terminal of the third capacitor; a source of the NMOS tube and another terminal of the third capacitor are both grounded; an output terminal of the dynamic comparator served as an output terminal of the peak detector is in connection with a gate of the PMOS tube, a source of the PMOS tube is in connection with a power supply voltage VDD through the current source, and a drain of the PMOS tube is in connection with one terminal of the third capacitor; and a clock input signal of the dynamic comparator is the signal $F_{64\times}$.

Further, the multiplexer is configured to select one signal from the signals Phase[7:0] as an injection signal according to the control signals EN[7:0], specifically, when an i-th signal EN[i] in the signals EN[7:0] is 1, then an i-th signal Phase[i] is selected from the signals Phase[7:0] as the injection signal, where $0 \le i \le 7$.

Further, the digital module is further configured to switch the eight-bit control signals EN[7:0] through discriminating the edge relation between the signal $PD_{IN}$ and the signal $BUFF_{OUT}$, which is specifically as follow.

When an i-th control signal EN[i] in the control signals EN[7:0] satisfies EN[i]=1, and $F_{64\times} > 64 \times F_{OSC}$ at a current time instant, then a value for the signal $BUFF_{OUT}$ is detected by the digital module at a specified rising edge of the $PD_{IN}$; when the $BUFF_{OUT}$ is 1, then the EN[i] is set to 0 and an EN[i+1] is set to 1; when i=7, then an EN[7] is set to 0 and an EN[0] is set to 1; and when the $BUFF_{OUT}$ is 0, then the EN[i]=1 is remained to be unvaried, where $0 \le i \le 7$.

When the i-th control signal EN[i] in the control signals EN[7:0] satisfies EN[i]=1, and $F_{64\times} < 64 \times F_{OSC}$ at a current time instant, then the value for the signal $BUFF_{OUT}$ is detected by the digital module at a specified falling edge of the $PD_{IN}$; when the $BUFF_{OUT}$ is 1, then the EN[i] is remained to be unvaried, when the $BUFF_{OUT}$ is 0, then the EN[i] is set to 0 and an EN[i−1] is set to 1; and when i=0, then the EN[0] is set to 0, EN[7] is set to 1.

When the i-th control signal EN[i] in the control signal EN[7:0] satisfy EN[i]=1 and $F_{64\times} = 64 \times F_{OSC}$ at a current time instant, then the EN[i] is constantly remained to be unvaried during starting the high-frequency crystal oscillator.

Further, the multiplexer is configured to select one signal from the signals Phase[7:0] and record the signal as the signal $PD_{IN}$ according to a magnitude of the frequency of the square wave signal $F_{64\times}$ and the control signals EN[7:0], which is specifically as follow.

When an i-th control signal EN[i] in the control signals EN[7:0] satisfies EN[i]=1, and $F_{64\times} > 64 \times F_{OSC}$ at a current time instant, then the multiplexer is configured to select an (i+1)-th signal Phase[i+1] from the signals Phase[7:0] as the signal $PD_{IN}$, and when i=7, then the multiplexer is configured to select a signal Phase[0] as the signal $PD_{IN}$, where $0 \le i \le 7$.

When the i-th control signal EN[i] in the control signals EN[7:0] satisfy EN[i]=1, and $F_{64x}<64\times F_{OSC}$ at a current time instant, then the multiplexer is configured to select a signal Phase[i–1] as the signal $PD_{IN}$, and when i=0, then the multiplexer is configured to select a signal Phase[7] as the signal $PD_{IN}$.

Further, the digital module is further configured to receive an injection signal $Phase_{SEL}$, when the high-frequency crystal oscillator is started, the switch control signal $EN_{INJ}$ is 1, and a falling edge of the signal $Phase_{SEL}$ is counted, and when a count value reaches a preset times, then the digital module is configured to set the $EN_{INJ}$ to 0.

Beneficial effects: the present disclosure adopts the single-terminal injection, which can detect the injection situation in real time, avoid the blind injection, and ensure continuous and efficient energy injection and a relative large amplitude. In combination with the current injection technology requirements for the frequency accuracy of the injection source, the automatic phase error correction technology provided in the present disclosure, even for a relative large frequency error, can permanently keep the phase error within 45° through the automatic phase error correction technology, which extends the effective injection time, ensures the efficient energy injection, greatly reduces the frequency accuracy requirements for the signal source generating the energy injection signal, breaks the previous strict restrictions of the frequency accuracy of the injection signal source on the start-up time of the high-frequency crystal, thereby reducing the accuracy requirements for the design and the calibration of the injection signal source on the circuit chips of the high-frequency crystal oscillator, and significantly improving the chip yield.

BRIEF DESCRIPTION OF DRAWINGS

FIG. 5 illustrates a simulation waveform diagram of an operating sequence of a digital module which is configured to detect the phase error when the frequency of the high-frequency crystal oscillator is 24 MHz and the frequency of the ring oscillator is 1.54368 GHz (>64×24 MHz) in the present disclosure.

FIG. 6 illustrates a simulation waveform diagram of the digital module which is configured to constantly vary the phase control word of the injection signal according to the preset logic when the frequency of the high-frequency crystal oscillator is 24 MHz, and the frequency of the ring oscillator is 1.54368 GHz (>64×24 MHz) in the present disclosure.

FIG. 7 illustrates a simulation waveform diagram of two terminals of the high-frequency crystal and two terminals of the amplifier when the frequency of the high-frequency crystal oscillator is 24 MHz, and the frequency of the ring oscillator is 1.54368 GHz (>64× 24 MHz) in the present disclosure.

FIG. 8 illustrates a simulation waveform diagram of the ring oscillator, the 8-frequency-dividing circuit and the twisted ring counter when the frequency of the high-frequency crystal oscillator is 24 MHz and the frequency of the ring oscillator is 1.52832 GHz (<64×24 MHz) in the present disclosure.

DESCRIPTION OF EMBODIMENTS

The accompanying drawings constituting one part of the present disclosure are used to provide a further understanding of the present disclosure, and the exemplary embodiments of the present disclosure and the descriptions are used to illustrate the present disclosure, and do not constitute the improper limitations on the present disclosure.

Figure 1:
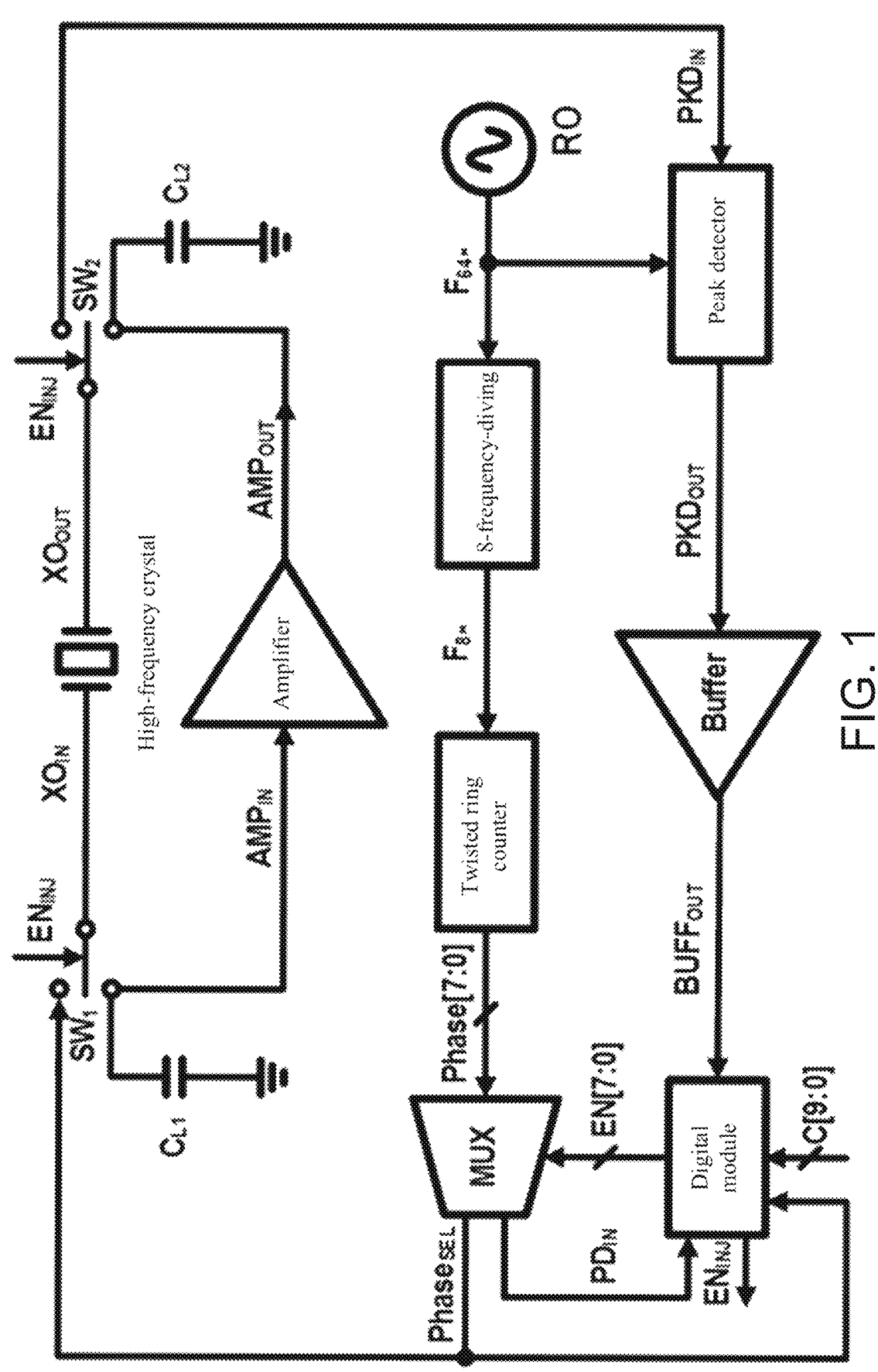
FIG. 1 illustrates an overall circuit diagram of the present disclosure.

As illustrated in FIG. 1, a high-frequency crystal oscillator based on automatic phase error correction provided in this embodiment includes a high-frequency crystal, a load capacitor $CL_1$, a load capacitor $CL_2$, a ring oscillator RO, an 8-frequency-dividing circuit, a twisted ring counter, a peak detector, a buffer, a digital module, a multiplexer MUX and an amplifier. The high-frequency crystal is a two-terminal component, and is configured to accurately generate a high-frequency oscillation signal with a frequency of $F_{OSC}$, and a left terminal of the high-frequency crystal is an $XO_{IN}$ terminal which is configured to inject the energy, and a right terminal of the high-frequency is an $XO_{OUT}$ terminal which is configured to detect the phase. The load capacitors $CL_1$ and $CL_2$ are both two-terminal components, and are configured to calibrate the oscillation frequency of the high-frequency crystal. The lower plate of the $CL_1$ is grounded, the upper plate of the $CL_1$ is in connection with the input terminal $AMP_{IN}$ of the amplifier. The lower plate of the $CL_2$ is grounded, and the upper plate of the $CL_2$ is in connection with the output terminal $AMP_{OUT}$ of the amplifier. The single-pole double-throw switches $SW_1$ and $SW_2$ are configured to switch between the two modes of the energy injection and the maintenance oscillation. The fixed terminal of the $SW_1$ is in connection with the $XO_{IN}$ terminal of the high-frequency crystal, the upper moving terminal of the $SW_1$ is in connection with one of the output terminals of the multiplexer MUX, and the lower moving terminal of the $SW_1$ is in connection with the upper plate of the $CL_1$ and the input terminal $AMP_{IN}$ of the amplifier. The fixed terminal of the $SW_2$ is in connection with the $XO_{OUT}$ terminal of the high-frequency crystal, the upper moving terminal of the $SW_2$ is in connection with the input terminal of the peak detector, and the lower moving terminal of the $SW_2$ is in connection with the upper plate of the $CL_2$ and the output terminal $AMP_{OUT}$ of the amplifier. The ring oscillator RO is configured to generate a square wave signal $F_{64x}$ with a frequency of approximately $64 \times F_{OSC}$, and the output terminal of the ring oscillator RO is in connection with the input terminal of the 8-frequency-dividing circuit and one input terminal of the peak detector. The 8-frequency-dividing circuit is configured to divide the input signal $F_{64x}$ (in this embodiment, the 8-frequency-dividing circuit is formed by cascading three 2-frequency-dividing circuits), a frequency-dividing signal $F_{8x}$ is output from the output terminal of the 8-frequency-dividing circuit, and the output terminal of the 8-frequency-dividing circuit is in connection with the input terminal of the twisted ring counter. The twisted ring counter is configured to divide the input signal again, and output eight signals Phase[7:0] with a same frequency and different phases. The signals Phase[7:0] output from the output terminal of the twisted ring counter are in connection with the eight input terminals of the multiplexer MUX correspondingly, which is the signals to be selected of the MUX. The peak detector is configured to detect the peak value for the input signal. The input signals of the peak detector are the signal $PKD_{IN}$ output from the $XO_{OUT}$ terminal of the crystal and the signal $F_{64x}$ output by the RO. The peak detector is configured to detect the peak value for the signal $PKD_{IN}$, and the peak detector is configured to utilize the square wave signal $F_{64x}$ as the high-frequency operating clock, reflect the peak position of the signal $PKD_{IN}$ by outputting the pulse signal $PKD_{OUT}$, and transmit the pulse signal $PKD_{OUT}$ to the buffer. The buffer is configured to expand the negative pulse width of the signal $PKD_{OUT}$, which is convenient for the digital module to process, the buffer is configured to transmit the $BUFF_{OUT}$ to the digital module after the expanded pulse signal $BUFF_{OUT}$ is obtained. The digital module is configured to identify the phase error between the injection signal and the oscillation signal and control the injection time sequence of the high-frequency crystal. The input signals of the digital module are the output signal $BUFF_{OUT}$ of the buffer, the output signal $PD_{IN}$ of the multiplexer MUX, the $Phase_{SEL}$ and the control word C[9:0] of the injection times input from the exterior. A switch control signal $EN_{INJ}$ is output from one output terminal of the digital module, and the switch control signal $EN_{INJ}$ is in connection with the control terminals of the single-pole double-throw switches $SW_1$ and $SW_2$, a multi-bit control words EN[7:0] (i.e., a control signal) is output from the other output terminal of the digital module, and the multi-bit control word EN[7:0] is in connection with one input terminal of a multiplexer MUX circuit. The multiplexer is configured to select one signal from the signals Phase[7:0] according to a magnitude of the frequency of the square wave signal $F_{64x}$ and the control signals EN[7:0], record the signal as the signal $PD_{IN}$, and input the signal $PD_{IN}$ into the digital module for participating in controlling the output signals EN[7:0] of the digital module. The multiplexer is further configured to select one signal in the signals Phase[7:0] as an injection signal according to the control signals EN[7:0] and inject the injection signal into the $XO_{IN}$ terminal of the high-frequency crystal oscillator through the first single-pole double-throw switch for starting the high-frequency crystal. The amplifier is configured to maintain the stable oscillation after the crystal is rapidly started, the input terminal of the amplifier is in connection with the upper plate of the $CL_1$ and the lower moving end of the $SW_1$, and the output terminal of the amplifier is in connection with the upper plate of the $CL_2$ and the lower moving terminal of the $SW_2$.

Figure 2:
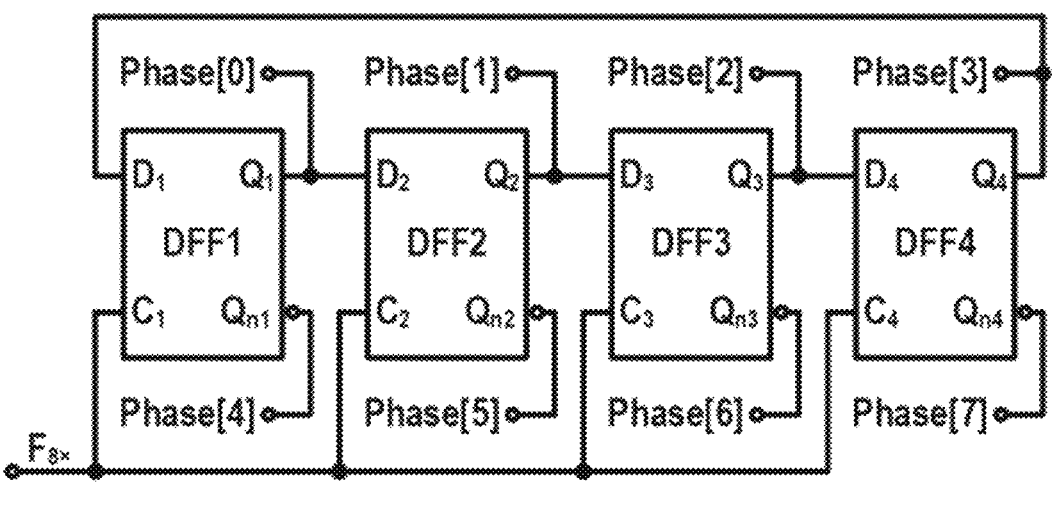
FIG. 2 illustrates a circuit diagram of a twisted ring counter of the present disclosure.

As illustrated in FIG. 2, the twisted ring counter includes four D flip-flops DFF1 to DFF4. Each of the D flip-flops has a data input terminal D, a clock control terminal C, a first output terminal Q and a second output terminal $Q_n$, and the signal output by the second output terminal is an inverted signal of the output signal of the first output terminal, and the clock control terminals of the first to fourth flip-flops are all in connection with the signal $F_{8x}$.

The data input terminal $D_1$ of the first D flip-flop DFF1 is in connection with the first output terminal $Q_4$ of the fourth D flip-flop DFF4, the clock control terminal $C_1$ of the first D flip-flop DFF1 is in connection with the output signal $F_{8x}$ of the 8-frequency-dividing circuit, the first output terminal $Q_1$ of the first D flip-flop DFF1 is in connection with the data input terminal $D_2$ of the second D flip-flop DFF2 and is served as the output signal Phase[0], and the second output terminal $Qn_1$ of the first D flip-flop is served as the output signal Phase[4]. The data input terminal $D_2$ of the second D flip-flop DFF2 is in connection with the first output terminal $Q_1$ of the first D flip-flop DFF1, the clock control terminal $C_2$ of the second D flip-flop DFF2 is in connection with the output signal $F_{8x}$ of the 8-frequency-dividing circuit, the first output terminal $Q_2$ of the second D flip-flop DFF2 is in connection with the data input terminal $D_3$ of the third D flip-flop DFF3 and is served as the output signal Phase[1], and the second output terminal $Qn_2$ of the second D flip-flop DFF2 is served as the output signal Phase[5]. The data input terminal $D_3$ of the third D flip-flop DFF3 is in connection with the first output terminal $Q_2$ of the second D flip-flop DFF2, the clock control terminal $C_3$ of the third D flip-flop DFF3 is in connection with the output signal $F_{8x}$ of the 8-frequency-dividing circuit, the first output terminal $Q_3$ of the third D flip-flop DFF3 is in connection with the data input terminal $D_4$ of the fourth D flip-flop DFF4 and is served as the output signal Phase[2], and the second output terminal $Qn_3$ of the third D flip-flop DFF3 is served as the output signal Phase[6]. The data input terminal $D_4$ of the fourth D flip-flop DFF4 is in connection with the first output terminal $Q_3$ of the third D flip-flop DFF3, the clock control terminal $C_4$ of the fourth D flip-flop DFF4 is in connection with the output signal $F_{8x}$ of the 8-frequency-dividing circuit, the first output terminal $Q_4$ of the fourth D flip-flop DFF4 is in connection with the data input terminal $D_1$ of the first D flip-flop DFF1 and is served as the output signal Phase[3], and the second output terminal $Qn_4$ of the fourth D flip-flop DFF4 is served as the output signal Phase[7]. The four D flip-flops implement the 8-frequency-dividing for the input signal $F_{8x}$, and simultaneously generate eight-path signals Phase[7:0] with a same frequency and different phases, and the frequencies of the signals Phase[7:0] are approximately $F_{OSC}$, and the phase of the signal Phase[j] is 45° ahead of the phase of the signal Phase[j+1], where j=0, 1, 2, . . . 6.

Figure 3:
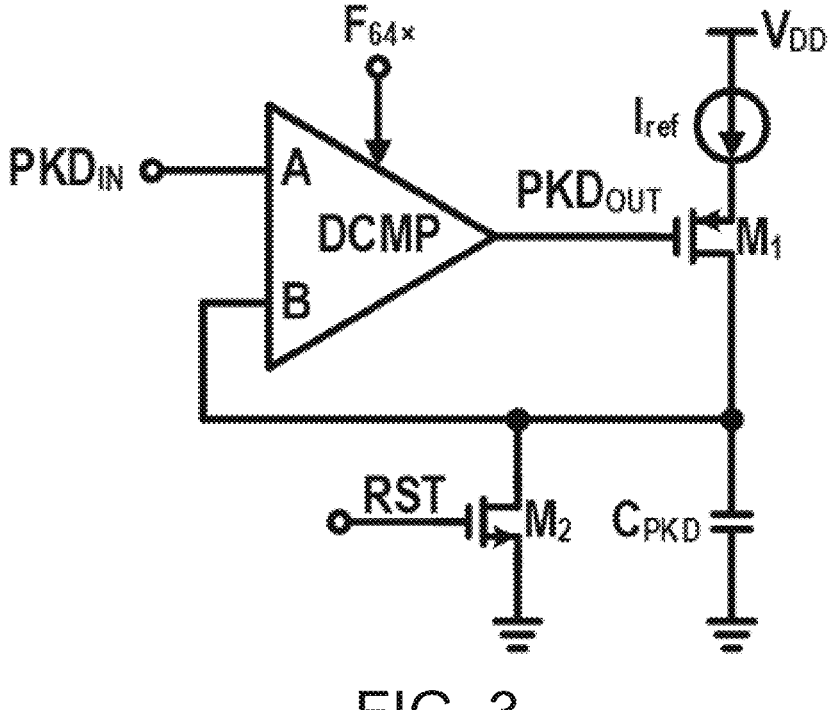
FIG. 3 illustrates a circuit diagram of a peak detector of the present disclosure.

As illustrated in FIG. 3, the peak detector includes a dynamic comparator DCMP, a capacitor $C_{PKD}$, a PMOS transistor $M_1$, an NMOS transistor $M_2$, and a current source $I_{ref}$.

The input terminal A (inverting input terminal) of the dynamic comparator is the input terminal of the peak detector, the input terminal B (non-inverting input terminal) of the dynamic comparator is in connection with the drain of the NMOS tube $M_2$, the upper plate of the capacitor $C_{PKD}$, and the drain of the PMOS tube $M_1$. The output signal $F_{64x}$ of the RO is served as the clock input signal of the dynamic comparator, and the output terminal of the dynamic comparator is in connection with the gate of the PMOS tube $M_1$ and is served as the output terminal of the peak detector. The lower plate of the capacitor $C_{PKD}$ is grounded, and the upper plate of the capacitor $C_{PKD}$ is in connection with the input terminal B of the dynamic comparator, the drain of the NMOS tube $M_2$, and the drain of the PMOS tube $M_1$. The gate of the PMOS tube $M_1$ is in connection with the output terminal of the dynamic comparator DCMP, the drain of the PMOS tube $M_1$ is in connection with the upper plate of the capacitor $C_{PKD}$, the input terminal B of the dynamic comparator and the drain of the NMOS tube $M_2$, and the source of the PMOS tube $M_1$ is in connection with the lower terminal of the current source $I_{ref}$. The gate of the NMOS tube $M_2$ is in connection with the reset signal RST, the drain of the NMOS tube $M_2$ is in connection with the upper plate of the capacitor $C_{PKD}$, the input terminal B of the dynamic comparator and the drain of the PMOS tube $M_1$, and the source of the NMOS tube $M_2$ is grounded. The upper terminal of the current source $I_{ref}$ is in connection with the power supply voltage VDD, and the lower terminal of the current source $I_{ref}$ is in connection with the source of the PMOS tube $M_1$. The peak detector is configured to detect the peak value for the input signal $PKD_{IN}$. Furthermore, due to the high-frequency operating clock $F_{64x}$, the peak detector can accurately reflect the peak position with the pulse signal $PKD_{OUT}$.

In consideration such as the power consumption and the detection accuracy, the operating frequency of the peak detection is variable, and the peak detector can be set to detect the peak value once every 1, 2 or 4 cycles according to the specific requirements.

The signals Phase[7:0] to be selected of the multiplexer MUX is provided by the twisted ring counter, and the control signals EN[7:0] is provided by the digital module. The control signals EN[7:0] are in one-to-one correspondence with the signals Phase[7:0] to be selected, that is, the EN[i] $(0 \le i \le 7)$ controls the on and off of the Phase[i] $(0 \le i \le 7)$ signal, and when EN[i]=1 $(0 \le i \le 7)$, then the multiplexer is configured to select the Phase[i] as the injection signal $Phase_{SEL}$.

The other output terminal $PD_{IN}$ of the multiplexer is depended not only by the control signals EN[7:0], but also by the magnitude of the output frequency $F_{64x}$ of the RO. The $F_{64x}$ is approximately 64 times the crystal oscillation frequency $F_{OSC}$, however, both of them are not exactly equal to each other, and the output rule of the signal $PD_{IN}$ is as follows.

In this embodiment, at the initial time instant, the digital module is given to output initial control signals EN[7:0] of 10000000, that is, EN[0]=1, and the rest of the control signals are 0. When EN[i]=1 $(0 \le i \le 6)$ and $F_{64x} > 64 \times F_{OSC}$ at the current time instant, the multiplexer is configured to select the Phase[i+1] as the output signal $PD_{IN}$. Specially, when EN[7]=1 and $F_{64x} > 64 \times F_{OSC}$, the multiplexer is configured to select the Phase[0] as the output signal $PD_{IN}$. When EN[i]=1 $(1 \le i \le 7)$ and $F_{64x} < 64 \times FOSC$ at the current time instant, the multiplexer is configured to select the Phase[i−1] as the output signal $PD_{IN}$. Specially, when EN[0]=1 and $F_{64x} < 64 \times F_{OSC}$, the multiplexer is configured to select the Phase[7] as the output signal $PD_{IN}$. It should be noted that, in this embodiment, at most one control word of EN[7:0] is set to 1 at the same time, and the rest of the control words are all 0.

The digital module is configured to identify the edge relation between the input signal $BUFF_{OUT}$ and the input signal $PD_{IN}$. Since the $BUFF_{OUT}$ is obtained by detecting the peak value for the waveform of the output signal $PKD_{IN}$ of the $XO_{OUT}$, the $BUFF_{OUT}$ reflects the $PKD_{IN}$, that is, the phase information of the crystal oscillation signal. The $PD_{IN}$ is a signal that deviates 45° from the injection signal $Phase_{SEL}$, and the $PD_{IN}$ indirectly contains the phase information of the injection signal $Phase_{SEL}$. The digital module is capable of identifying the phase error between the injection signal $Phase_{SEL}$ and the oscillation signal $PKD_{IN}$ through discriminating the edge relation between the input signal $BUFF_{OUT}$ and the input signal $PD_{IN}$. When the digital module detects that the phase difference between the injection signal $Phase_{SEL}$, and the oscillation signal $PKD_{IN}$ reaches 45°, the digital module is configured to vary the value for the EN[7:0], and select a signal from the Phase [7:0] according to the preset logic to assign to the injection signal $Phase_{SEL}$, and the output signal $PD_{IN}$. The method for identifying the phase error and the logic for varying the value for the EN[7:0] are as follows.

The detection of the Phase error and the switching of the injection signal:

When EN[i]=1$(0 \le i \le 6)$ and $F_{64x} > 64 \times FOSC$, then the value for the $BUFF_{OUT}$ is detected by the digital module at the specified rising edge of the $PD_{IN}$. When the $BUFF_{OUT}$ is detected to be 0, then EN[i]=1 is remained to be unvaried. When the $BUFF_{OUT}$ is detected to be 1, then the EN[i] is set to 0 and the EN[i+1] is set to 1. Specially, when EN[7]=1 and $F_{64x} > 64 \times F_{OSC}$, the value for the $BUFF_{OUT}$ is detected by the digital module at the specified rising edge of the $PD_{IN}$. When the $BUFF_{OUT}$ is detected to be 0, then the EN[7]=1 is remained to be unvaried, and when the $BUFF_{OUT}$ is detected to be 1, the EN[7] is set to 0 and the EN[0] is set to 1.

When EN[i]=1 $(1 \le i \le 7)$ and $F_{64x} < 64 \times FOSC$, the value for the $BUFF_{OUT}$ is detected by the digital module at the specified falling edge of the $PD_{IN}$. When the $BUFF_{OUT}$ is detected to be 1, then EN[i]=1 is remained to be unvaried. When the $BUFF_{OUT}$ is detected to be 0, then the EN[i] is set to 0 and the EN[i−1] is set to 1. Specially, when EN[0]=1 and $F_{64x} < 64 \times FOSC$, the value for the $BUFF_{OUT}$ is detected by the digital module at the falling edge of the $PD_{IN}$. When the $BUFF_{OUT}$ is detected to be 1, then EN[0]=1 is remained to be unvaried, and when the $BUFF_{OUT}$ is detected to be 0, then the EN[0] is set to 0 and the EN[7] is set to 1.

When EN[i]=1 $(0 \le i \le 7)$ and $F_{64x} = 64 \times FOSC$, the phase error between the injection signal and the oscillation signal is extremely tiny, and the phase of the injection signal $Phase_{SEL}$ is not required to be switched, EN[i]=1 is remained to be unvaried until the injection is completed.

Injection and Switching:

In the process that the digital module constantly switches the phase of the $Phase_{SEL}$ signal for injecting at the $XO_{IN}$ terminal of the crystal, the digital module is configured to set the $EN_{INJ}$ to 1, and the $Phase_{SEL}$ is in connection with the $XO_{IN}$, and the $PKD_{IN}$ is in connection with the $XO_{OUT}$ through controlling the $SW_1$ and the $SW_2$. The process is called as the injection phase, which is the process of starting the high-frequency crystal. After the injection is completed, the crystal oscillator is switched into the maintenance stage, and the digital module is configured to set the $EN_{INJ}$ to 0 (as illustrated in FIG. 1, the input signals C[9:0] of the digital module is utilized to preset the injection times, the digital module is configured to count the falling edge of the $Phase_{SEL}$ signal, when the count value reaches the times preset by the C[9:0], the digital module is configured to set the $EN_{INJ}$ to 0, and the injection is completed). The $AMP_{IN}$ is in connection with the $XO_{IN}$, and the $AMP_{OUT}$ is in connection with the $XO_{OUT}$ through controlling the $SW_1$ and the $SW_2$. In the maintenance stage, the capacitances of the capacitors $CL_1$ and $CL_2$ are automatically adjustable, which plays a role in stabilizing the crystal oscillation frequency, and optimizing the phase noise and the jitter performance. The amplifier plays a role in maintaining the crystal oscillation signal, so that the oscillation signal does not attenuate and disappear after the crystal is disconnected from the energy injection, thereby providing a stable oscillation signal.

In the rapid startup high-frequency crystal oscillator based on the automatic phase error correction technology provided in this embodiment, the frequency of the high-frequency crystal is 24 MHz and the frequency of the ring oscillator is 1.54368 GHZ (>64×24 MHz), and the simulation waveforms are as illustrated in FIGS. 4, 5, 6 and 7.

Figure 4:
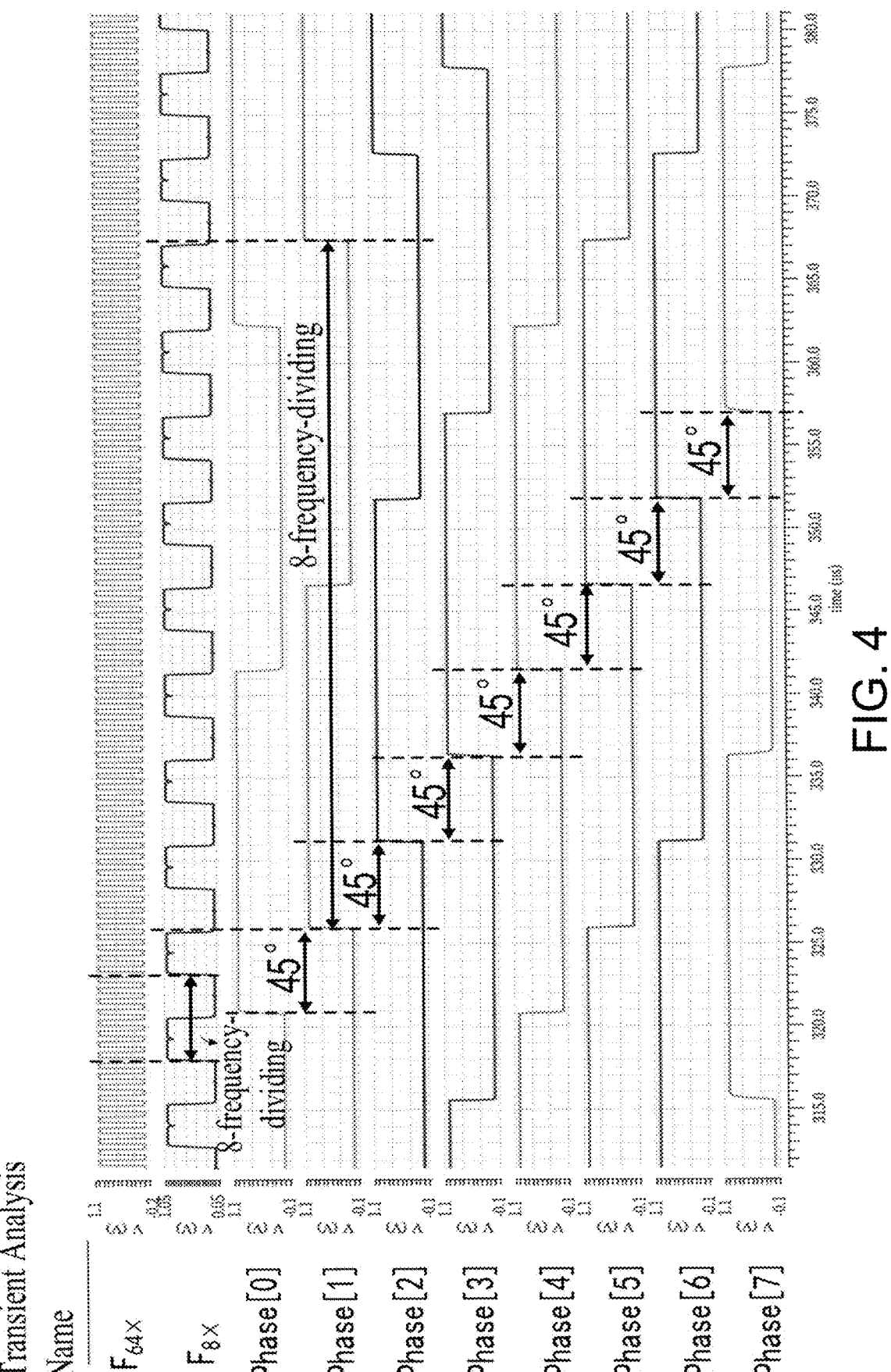
FIG. 4 illustrates a simulation waveform diagram of a ring oscillator, a 8-frequency-dividing circuit and the twisted ring counter when the frequency of the high-frequency crystal oscillator is 24 MHz and the frequency of the ring oscillator is 1.54368 GHZ (>64×24 MHz) in the present disclosure.

As illustrated in FIG. 4, the ring oscillator is configured to output a square wave signal $F_{64x}$ with a frequency of 1.54368 GHz. The 8-frequency-dividing circuit is configured to divide the $F_{64x}$ by 8 to obtain the $F_{8x}$ signal. The twisted ring counter is configured to further divide the $F_{8x}$ signal and generate eight signals Phase[7:0] with a same frequency and different phases. The frequency of the Phase [7:0] is approximately $F_{OSC}$, and the Phase[j] is 45° ahead of the Phase[j+1] (i>0).

Figure 5:
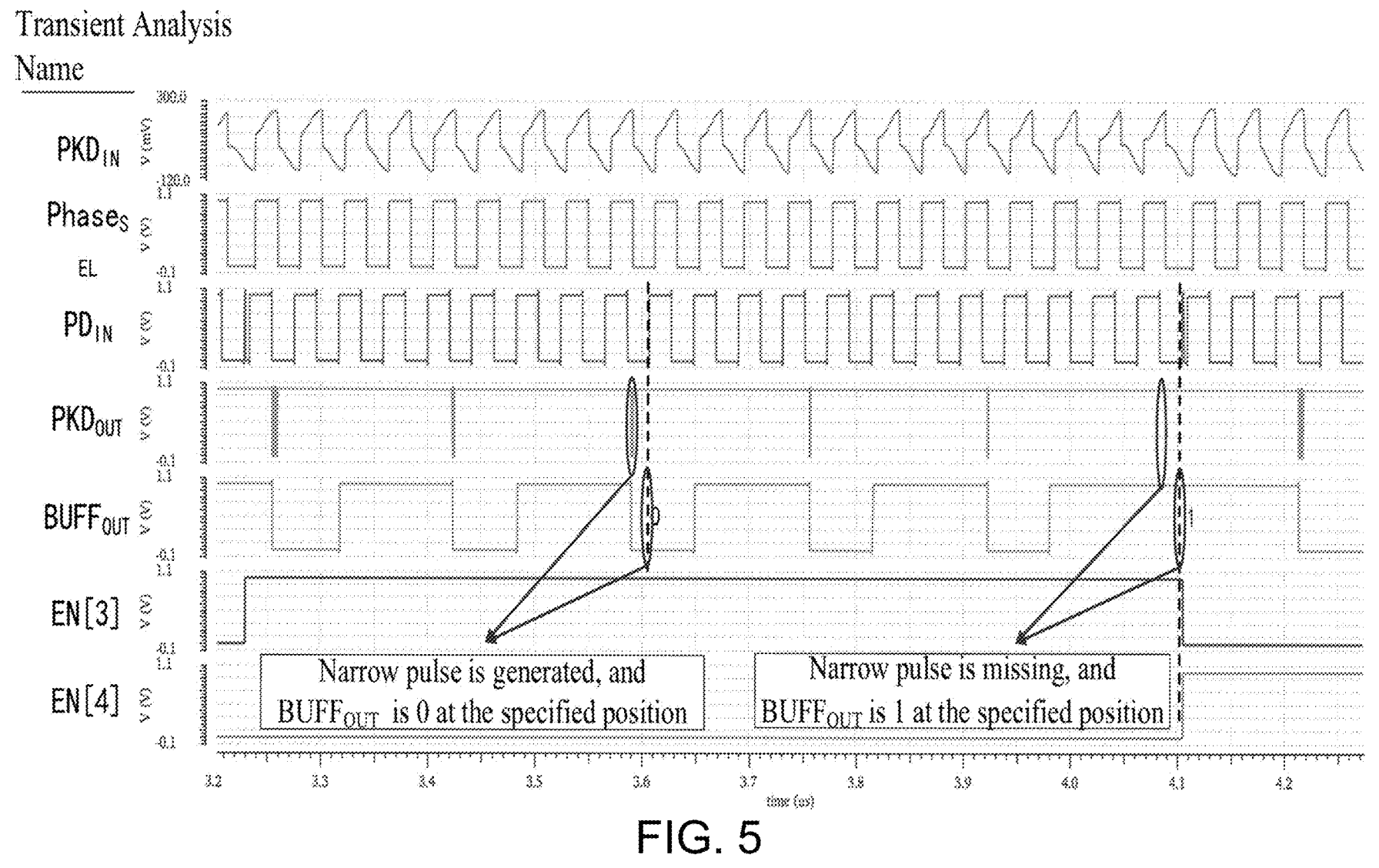

As illustrated in FIG. 5, the $PKD_{IN}$ is the input signal of the peak detector. The peak detector is configured to detect the peak value once every 4 cycles to obtain an output signal $PKD_{OUT}$ reflecting whether the peak value is increased. As illustrated in FIG. 5, the variation of the control words from EN[3]=1, EN[4]=0 to EN[3]=0, EN[4]=1 is taken as an example, firstly, when EN[3]=1, then the Phase[3] is selected as the injection signal to assign to the $Phase_{SEL}$, and meanwhile, the peak detector is configured to monitor the peak growth, when the negative pulse widths of the $PKD_{OUT}$ and the $BUFF_{OUT}$ are missing, it indicates that the peak is no longer growing, the injection is continued to be proceeded with the Phase[3], the efficiency is reduced or even the crystal energy growth is inhibited, and the phase of the injection signal $Phase_{SEL}$ is required to be switched. Subsequently, the $BUFF_{OUT}$ detected by the digital module at the specified falling edge of $PD_{IN}$ is 1 that is, the negative pulse width is missing, then the digital module is configured to set the EN[3] to 0, set the EN[4] to 1, and select the Phase[4] as the injection signal to assign to $Phase_{SEL}$, and the energy injection is continued to be proceeded.

Figure 6:
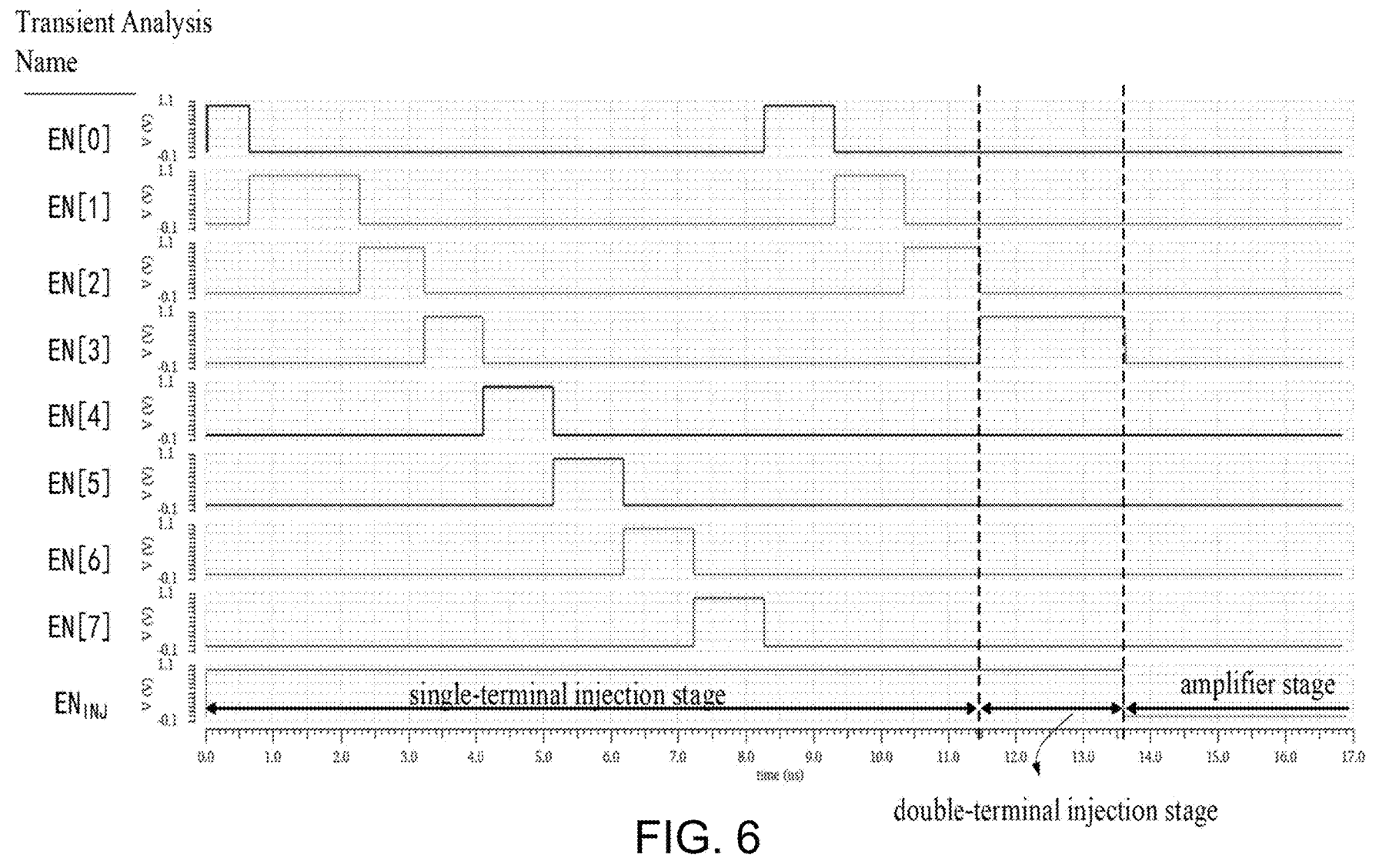
Figure 7:
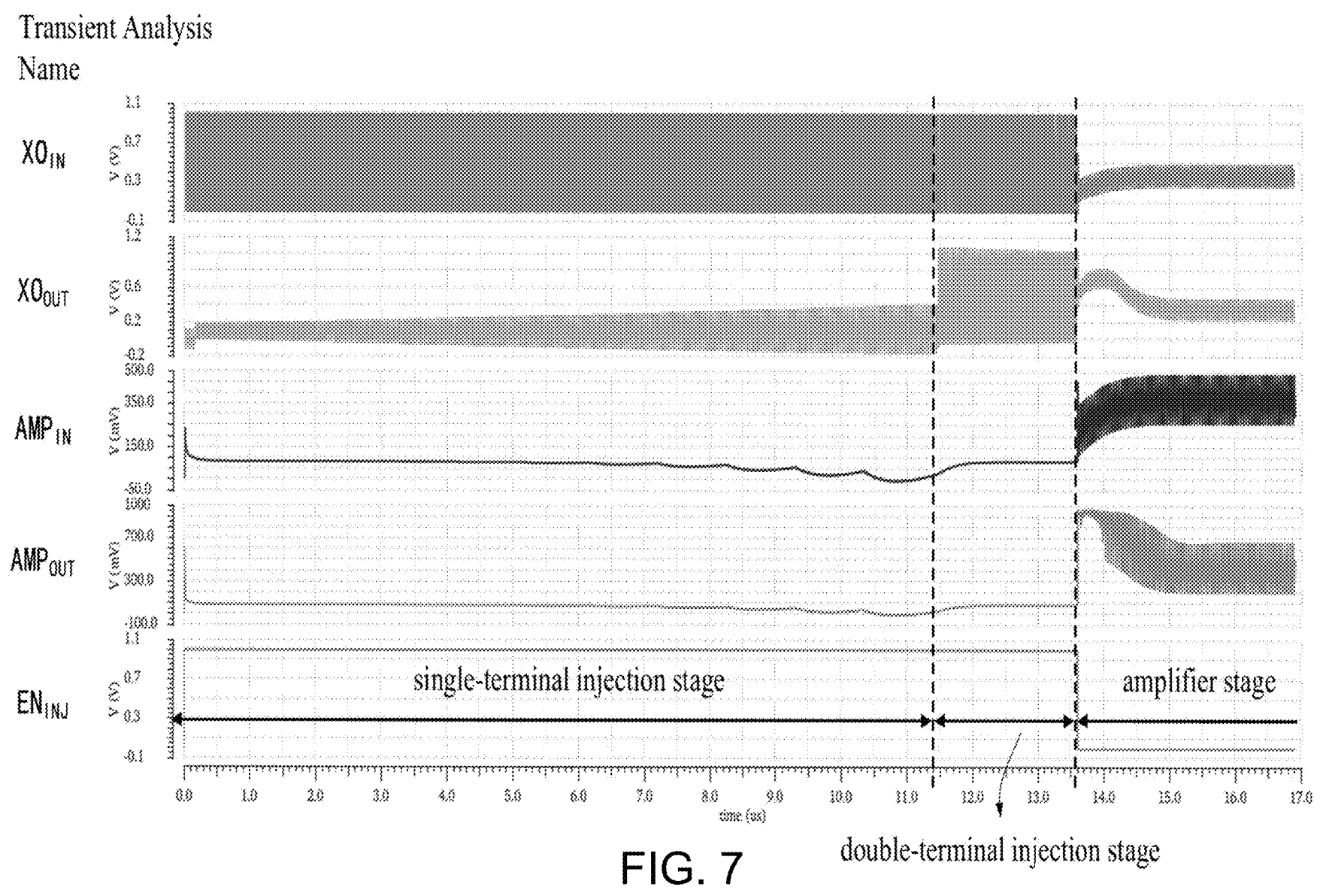

As illustrated in FIG. 6, the EN[7:0] utilized for controlling the phase of the injection signal $Phase_{SEL}$ is constantly jumped, which ensures that the energy is efficiently injected into the crystal continuously until the injection is completed. The control signal $EN_{INJ}$ is varied from 1 to 0, and the high-frequency crystal is in connection with the amplifier for maintaining the steady-state oscillation. As illustrated in FIG. 7, in order to further improve the energy injection efficiency, the single-terminal injection is adopted in the early stage of the energy injection process, the $XO_{IN}$ is utilized for the square wave injection, and the $XO_{OUT}$ is configured to detect the phase error; and the double-terminal injection is adopted in the last injection of the energy injection process, and both the $XO_{IN}$ and the $XO_{OUT}$ have square waves. After the injection is completed, the control signal $EN_{INJ}$ is varied from 1 to 0, the crystal is in connection with the amplifier, and the waveforms are generated at the input $AMP_{IN}$ and the output $AMP_{OUT}$ of the amplifier.

When the frequency of the high-frequency crystal is 24 MHz and the frequency of the ring oscillator is 1.52832 GHz (<64×24 MHz), the simulation waveforms are as illustrated in FIGS. 8, 9, 10, and 11.

Figure 8:
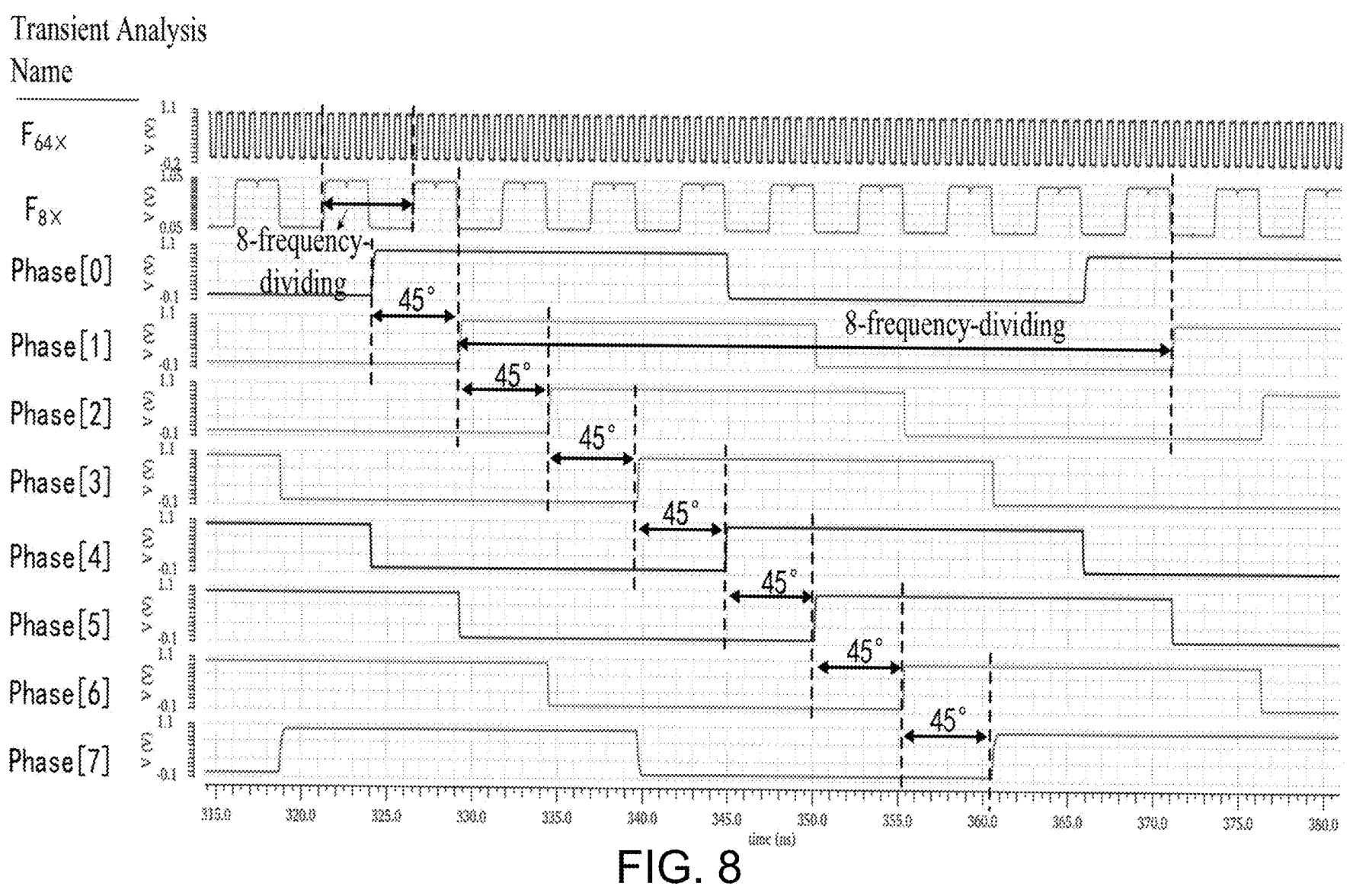

As illustrated in FIG. 8, the ring oscillator is configured to output a square wave signal $F_{64x}$ with a frequency of 1.52832 GHz. The 8-frequency-dividing circuit is configured to divide the $F_{64x}$ by eight to obtain the $F_{8x}$ signal. The twisted ring counter is configured to further divide the $F_{8x}$ signal and generate eight-path signals Phase[7:0] with a same frequency and different phases. The frequency of the Phase[7:0] is approximately $F_{OSC}$, and the Phase[i] is 45° ahead of the Phase[i+1].

Figure 9:
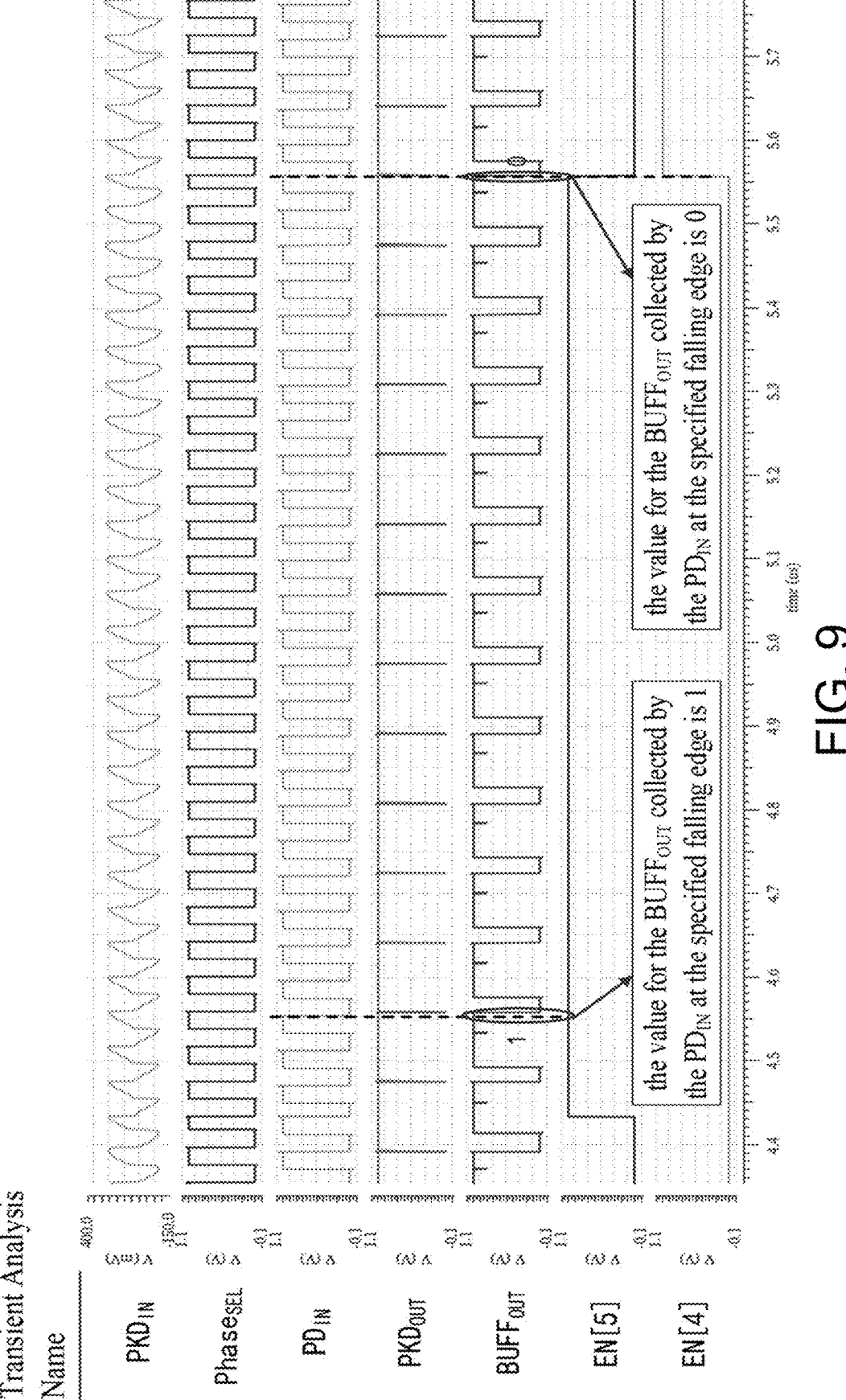
FIG. 9 illustrates a simulation waveform diagram of the operating sequence of the digital module which is configured to detect the phase error when the frequency of the high-frequency crystal oscillator is 24 MHz and the frequency of the ring oscillator is 1.52832 GHz (<64×24 MHz) in the present disclosure.

As illustrated in FIG. 9, the $PKD_{IN}$ is the input signal of the peak detector. The peak detector is configured to detect the peak value once every two cycles to obtain the output signal $PKD_{OUT}$ reflecting whether the peak value is increased. As illustrated in FIG. 9, the variation of the control words from EN[5]=1, EN[4]=0 to EN[5]-0, EN[4]=1 is taken as an example, firstly, when EN[5]=1, the Phase[5] is selected as the injection signal to assign to the $Phase_{SEL}$, and meanwhile, the peak detector is configured to monitor the peak value, when the value for the $BUFF_{OUT}$ collected by the $PD_{IN}$ at the specified falling edge is 0, it indicates that the phase error accumulation reaches 45°, the injection is continued to be proceeded with the Phase[5], the efficiency is reduced and even the crystal energy growth is inhibited, and the phase of the injection signal $Phase_{SEL}$ is required to be switched, then, the digital module is configured to set the EN[5] to 0, set the EN[4] to 1, and select the Phase[4] as the injection signal to assign to the $Phase_{SEL}$, and the energy injection is continued to be proceed.

Figure 10:
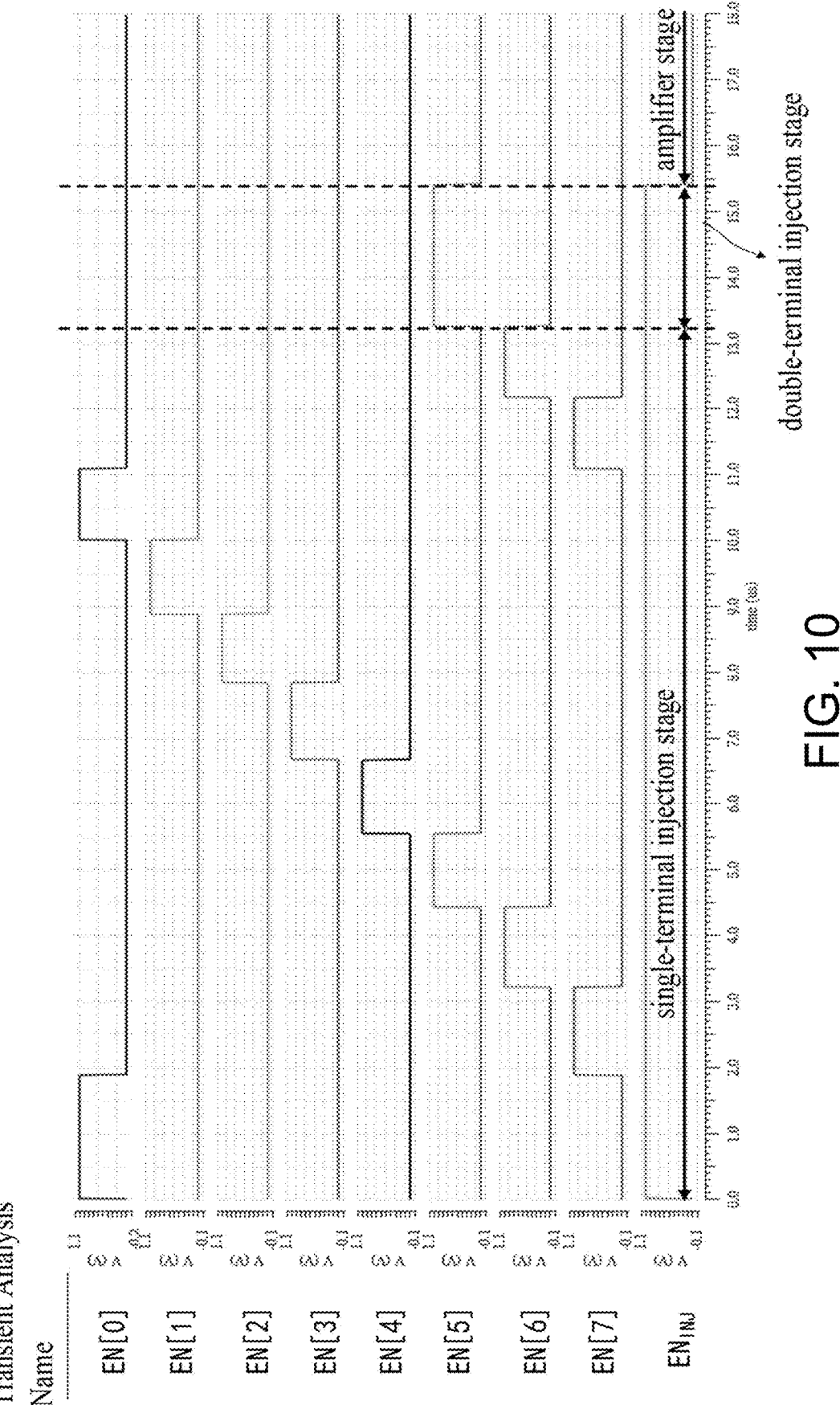
FIG. 10 illustrates a simulation waveform diagram of the digital module which is configured to constantly vary the phase control word of the injection signal according to the preset logic when the frequency of the high-frequency crystal oscillator is 24 MHz and the frequency of the ring oscillator is 1.52832 GHz (<64×24 MHz) in the present disclosure.
Figure 11:
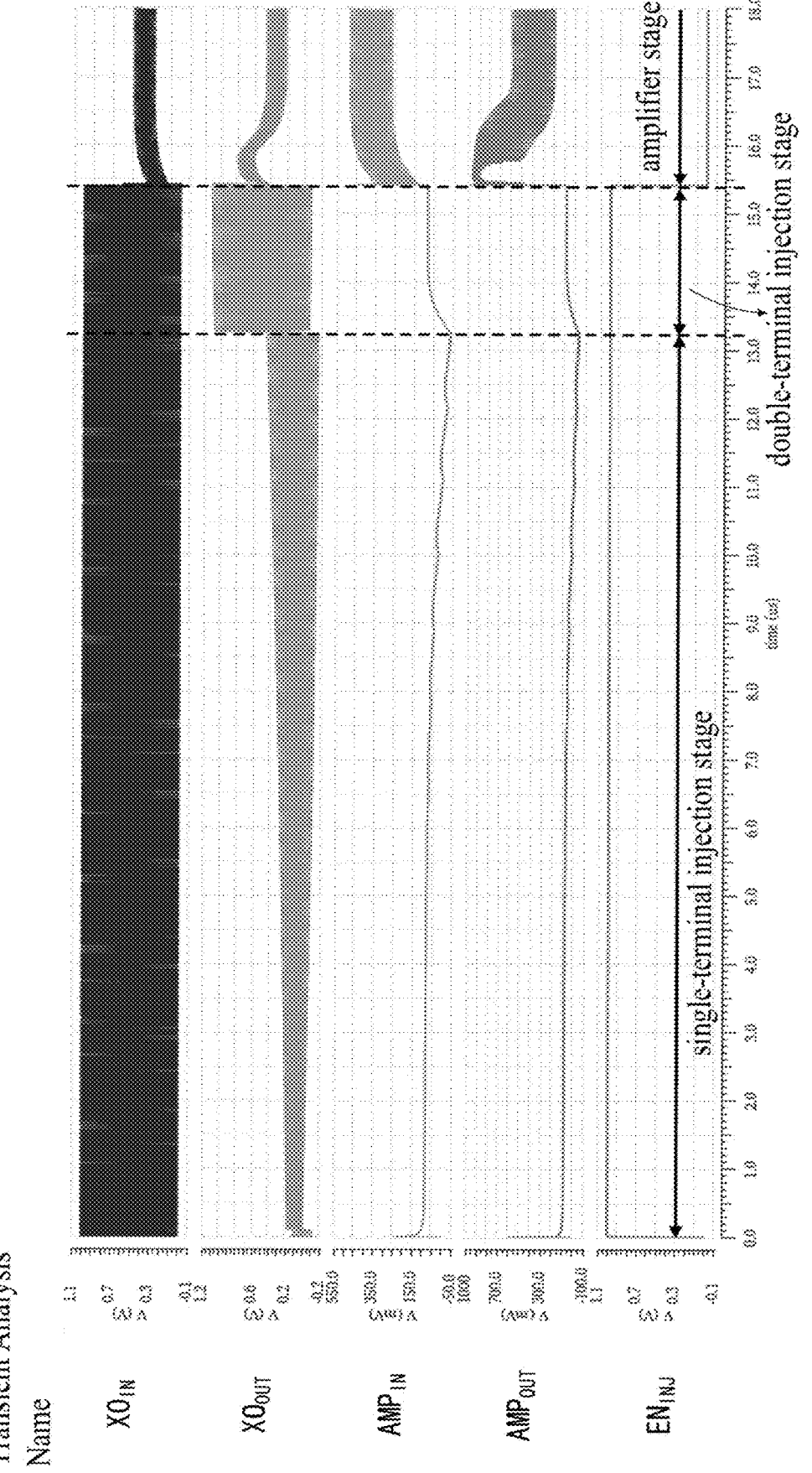
FIG. 11 illustrates a simulation waveform diagram of two terminals of the high-frequency crystal and two terminals of the amplifier when the frequency of the high-frequency crystal oscillator is 24 MHz and the frequency of the ring oscillator is 1.52832 GHz (<64×24 MHz) in the present disclosure.

As illustrated in FIG. 10, the EN[7:0] utilized for controlling the phase of the injection signal $Phase_{SEL}$ is constantly jumped, which ensures that the energy is efficiently injected into the crystal continuously, until the injection is completed. The control signal $EN_{INJ}$ is varied from 1 to 0, and the crystal is in connection with the amplifier for maintaining the steady-state oscillation. As illustrated in FIG. 11, in order to further improve the energy injection efficiency, the single-terminal is adopted in the early stage of the energy injection process, the $XO_{IN}$ is utilized for the square wave injection, and the $XO_{OUT}$ is for detecting the phase error; and the double-terminal injection is adopted in the last injection of the energy injection process, and both the $XO_{IN}$ and the $XO_{OUT}$ have square waves. After the injection is completed, the control signal $EN_{INJ}$ is varied from 1 to 0, the crystal is in connection with the amplifier, and the waveforms are generated at the input $AMP_{IN}$ and the output $AMP_{OUT}$ of the amplifier.

In addition, it should be noted that the various specific technical features described in the above specific embodiments can be combined in an arbitrary suitable manner without contradiction. In order to avoid the unnecessary repetition, the various possible combinations are not further described in the present disclosure.

What is claimed is:

1. A high-frequency crystal oscillator based on an automatic phase error correction, wherein the high-frequency crystal oscillator includes a high-frequency crystal, a first load capacitor, a second load capacitor, a ring oscillator, an eight-frequency-dividing circuit, a twisted ring counter, a peak detector, a buffer, a digital module, a multiplexer, an amplifier, a first single-pole double-throw switch and a second single-pole double-throw switch; one terminal of the high-frequency crystal is recorded as an $XO_{IN}$, and another terminal of the high-frequency crystal is recorded as an $XO_{OUT}$; a fixed terminal of the first single-pole double-throw switch is in connection with the terminal $XO_{IN}$ of the high-frequency crystal, a first moving terminal of the first single-pole double-throw switch is in connection with the multiplexer, and a second moving terminal of the first single-pole double-throw switch is in connection with one terminal of the first load capacitor and an input terminal of the amplifier; a fixed terminal of the second single-pole double-throw switch is in connection with the terminal $XO_{OUT}$ of the high-frequency crystal, a first moving terminal of the second single-pole double-throw switch is in connection with the peak detector, a second moving terminal of the second single-pole double-throw switch is in connection with one terminal of the second load capacitor and an output terminal of the amplifier, and another terminals of the first and second load capacitors are both grounded;

when the high-frequency crystal oscillator is started, a digital module is adopted to generate a switch control signal $EN_{INJ}$ for controlling the fixed terminal of the first single-pole double-throw switch to be in connection with the first moving terminal of the first single-pole double-throw switch, and controlling the fixed terminal of the second single-pole double-throw switch to be in connection with the first moving terminal of the second single-pole double-throw switch; and the ring oscillator is configured to generate a square wave signal $F_{64x}$, and transmit the square wave signal to the eight-frequency-dividing circuit and the peak detector; the eight-frequency-dividing circuit is configured to divide the square wave signal to generate a frequency-dividing signal $F_{8x}$, and transmit the $F_{8x}$ to the twisted ring counter, and the twisted ring counter is configured to divide the $F_{8x}$ again to generate eight signals Phase[7:0] with a same frequency and different phases, and transmit the signals Phase[7:0] to the multiplexer; the peak detector is further configured to receive a signal $PKD_{IN}$ output by the terminal $XO_{OUT}$ of the high-frequency crystal, and the peak detector is configured to take the square wave signal $F_{64x}$ as a high-frequency operating clock, reflect a peak position of the signal $PKD_{IN}$ by outputting a pulse signal $PKD_{OUT}$, and transmit the pulse signal $PKD_{OUT}$ to the buffer; and the buffer is configured to expand a negative pulse width of the pulse signal $PKD_{OUT}$ and transmit a $BUFF_{OUT}$ to the digital module after an expanded pulse signal $BUFF_{OUT}$ is obtained; the digital module is configured to generate initial control signals EN[7:0], the control signals EN[7:0] are eight-bit control signals, the digital module is configured to switch the control signals EN[7:0] by discriminating an edge relation between a signal $PD_{IN}$ and the signal $BUFF_{OUT}$, and transmit the switched control signals EN[7:0] to the multiplexer; the multiplexer is configured to select one signal from signals Phase[7:0] according to a magnitude of the frequency of the square wave signal $F_{64x}$ and the control signals EN[7:0] and record as the signal $PD_{IN}$ to input into the digital module; the multiplexer is further configure to select one signal from the signals Phase[7:0] as an injection signal according to the control signals EN[7:0] to inject into the terminal $XO_{IN}$ of the high-frequency crystal through the first single-pole double-throw switch, and the injection signal is coupled to the terminal $XO_{OUT}$ through the high-frequency crystal, and is superimposed with a high-frequency oscillation signal $F_{OSC}$ generated by the high-frequency crystal at the terminal $XO_{OUT}$ to obtain the signal $PKD_{IN}$, and the signal $PKD_{IN}$ is input to the peak detector through the second single-pole double-throw switch; and in a maintenance stage, the switch control signal $EN_{INJ}$ is for controlling the fixed terminal of the first single-pole double-throw switch to be in connection with the second moving terminal of the first single-pole double-throw switch, and controlling the fixed terminal of the second single-pole double-throw switch to be in connection with the second moving terminal of the second single-pole double-throw switch.

2. The high-frequency crystal oscillator based on the automatic phase error correction according to claim 1, wherein the twisted ring counter includes first to fourth triggers; the first to fourth triggers are all D triggers having a data input terminal, a clock control terminal, a first output terminal and a second output terminal, and a signal output by the second output terminal of each D trigger is an inverted signal of a signal output by the first output terminal of each D trigger; the clock control terminals of the first to fourth triggers are all in connection with the signal $F_{8x}$;

the data input terminal of the first trigger is in connection with the first output terminal of the fourth trigger, a signal output by the first output terminal of the first trigger is served as a first bit signal in the Phase[7:0] and recorded as a Phase[0], and is in connection with the data input terminal of the second trigger; a signal output by the first output terminal of the second trigger is served as a second bit signal in the Phase[7:0] and recorded as a Phase[1], and in connection with the data input terminal of the third trigger; a signal output by the first output terminal of the third trigger is served as a third bit signal in the Phase[7:0] and recorded as a Phase[2], and in connection with the data input terminal of the fourth trigger; a signal output by the first output terminal of the fourth trigger is served as a fourth bit signal in the Phase[7:0] and recorded as a Phase[3]; signals output by the second output terminals of the first to fourth triggers are respectively served as fifth, sixth, seventh and eighth bit signals in the Phase[7:0], and sequentially recorded as a Phase[4], a Phase[5], a Phase[6] and a Phase[7]; and a phase of a signal Phase[j] is 45° ahead of a phase of a signal Phase[j+1], where j=0, 1, 2, . . . 6.

3. The high-frequency crystal oscillator based on the automatic phase error correction according to claim 1, wherein the peak detector includes a dynamic comparator, a third capacitor, a PMOS tube, an NMOS tube and a current source; an inverting input terminal of the dynamic comparator served as an input terminal of the peak detection is in connection with the signal $PKD_{IN}$; a non-inverting input terminal of the dynamic comparator is in connection with a drain of the NMOS tube and one terminal of the third capacitor; a source of the NMOS tube and another terminal of the third capacitor are both grounded; an output terminal of the dynamic comparator served as an output terminal of the peak detector is in connection with a gate of the PMOS tube, a source of the PMOS tube is in connection with a power supply voltage VDD through the current source, and a drain of the PMOS tube is in connection with one terminal of the third capacitor; and a clock input signal of the dynamic comparator is the signal $F_{64x}$.

4. The high-frequency crystal oscillator based on the automatic phase error correction according to claim 1, wherein the multiplexer is configured to select one signal from the signals Phase[7:0] as an injection signal according to the control signals EN[7:0], specifically, when an i-th signal EN[i] in the signals EN[7:0] is 1, then an i-th signal Phase[i] is selected from the signals Phase[7:0] as the injection signal, where 0≤i≤7.

5. The high-frequency crystal oscillator based on the automatic phase error correction according to claim 1, wherein the digital module is further configured to switch the eight-bit control signals EN[7:0] through discriminating the edge relation between the signal $PD_{IN}$ and the signal $BUFF_{OUT}$, specifically, when an i-th control signal EN[i] in the control signals EN[7:0] satisfies EN[i]=1, and $F_{64x}>64\times F_{OSC}$ at a current time instant, then a value for the signal $BUFF_{OUT}$ is detected by the digital module at a specified rising edge of the $PD_{IN}$; when the $BUFF_{OUT}$ is 1, then the EN[i] is set to 0 and an EN[i+1] is set to 1; when i=7, then an EN[7] is set to 0 and an EN[0] is set to 1; and when the $BUFF_{OUT}$ is 0, then the EN[i]=1 is remained to be unvaried, where 0≤i≤7;

when the i-th control signal EN[i] in the control signals EN[7:0] satisfies EN[i]=1, and $F_{64x} < 64 \times F_{OSC}$ at a current time instant, then the value for the signal $BUFF_{OUT}$ is detected by the digital module at a specified falling edge of the $PD_{IN}$; when the $BUFF_{OUT}$ is 1, then the EN[i] is remained to be unvaried, when the $BUFF_{OUT}$ is 0, then the EN[i] is set to 0 and an EN[i−1] is set to 1; and when i=0, then the EN[0] is set to 0, EN[7] is set to 1; and when the i-th control signal EN[i] in the control signals EN[7:0] satisfy EN[i]=1 and $F_{64x}=64 \times F_{OSC}$ at a current time instant, then the EN[i] is constantly remained to be unvaried during starting the high-frequency crystal oscillator.

6. The high-frequency crystal oscillator based on the automatic phase error correction according to claim 1, wherein the multiplexer is configured to select one signal from the signals Phase[7:0] and record as the signal $PD_{IN}$ according to a magnitude of the frequency of the square wave signal $F_{64x}$ and the control signals EN[7:0], specifically, when an i-th control signal EN[i] in the control signals EN[7:0] satisfies EN[i]=1, and $F_{64x} > 64 \times F_{OSC}$ at a current time instant, then the multiplexer is configured to select an (i+1)-th signal Phase[i+1] from the signals Phase[7:0] as the signal $PD_{IN}$, and when i=7, then the multiplexer is configured to select a signal Phase[0] as the signal $PD_{IN}$, where 0≤i≤7; and when the i-th control signal EN[i] in the control signals EN[7:0] satisfy EN[i]=1, and $F_{64x} < 64 \times F_{OSC}$ at a current time instant, then the multiplexer is configured to select a signal Phase[i−1] as the signal $PD_{IN}$, and when i=0, then the multiplexer is configured to select a signal Phase[7] as the signal $PD_{IN}$.

7. The high-frequency crystal oscillator based on the automatic phase error correction according to claim 1, wherein the digital module is further configured to receive an injection signal $Phase_{SEL}$, when the high-frequency crystal oscillator is started, the switch control signal $EN_{INJ}$ is 1, and a falling edge of the signal $Phase_{SEL}$ is counted, and when a count value reaches a preset times, then the digital module is configured to set the $EN_{INJ}$ to 0.

\* \* \* \* \*